US012796286B2

(12) United States Patent
Tabatake et al.

(10) Patent No.: US 12,796,286 B2
(45) Date of Patent: Nov. 10, 2026

(54) DISPLAY DEVICE COMPRISING ORGANIC LIGHT EMITTING DIODE (LED) INCLUDING CONVEX DAM STRUCTURE

(71) Applicant: Magnolia White Corporation, Tokyo (JP)

(72) Inventors: Hiroshi Tabatake, Tokyo (JP); Hideyuki Takahashi, Tokyo (JP)

(73) Assignee: MAGNOLIA WHITE CORPORATION, Tokyo (JP)

( * ) Notice: Subject to any disclaimer, the term of this patent is extended or adjusted under 35 U.S.C. 154(b) by 342 days.

(21) Appl. No.: 18/593,687

(22) Filed: Mar. 1, 2024

(65) Prior Publication Data

US 2024/0298503 A1 Sep. 5, 2024

(30) Foreign Application Priority Data

Mar. 2, 2023 (JP) ................................ 2023-032017

(51) Int. Cl.
*H10K 59/80* (2023.01)
*H10K 59/131* (2023.01)
*H10K 59/40* (2023.01)

(52) U.S. Cl.
CPC ....... *H10K 59/8722* (2023.02); *H10K 59/131* (2023.02); *H10K 59/40* (2023.02)

(58) Field of Classification Search
CPC .... H10K 59/122; H10K 59/131; H10K 59/40; H10K 59/873; H10K 59/8722; H10K 59/80522; H10K 59/12; H10K 59/87
USPC ....................................... 257/40; 438/82, 99
See application file for complete search history.

(56) References Cited

U.S. PATENT DOCUMENTS

| | | | | |
|---|---|---|---|---|
| 2004/0160170 | A1 | 8/2004 | Sato et al. | |
| 2009/0009069 | A1 | 1/2009 | Takata | |
| 2019/0363275 | A1 | 11/2019 | Ochi et al. | |
| 2020/0052051 | A1* | 2/2020 | Lee | H10D 86/451 |
| 2020/0411629 | A1* | 12/2020 | Kim | H10K 59/122 |
| 2021/0391555 | A1* | 12/2021 | Kim | H10K 50/8445 |
| 2022/0123076 | A1* | 4/2022 | Kim | H10K 59/88 |
| 2023/0239961 | A1* | 7/2023 | Lu | H04L 1/1848<br>370/311 |

FOREIGN PATENT DOCUMENTS

| | | |
|---|---|---|
| JP | 2000-195677 A | 7/2000 |
| JP | 2004-207217 A | 7/2004 |
| JP | 2008-135325 A | 6/2008 |

(Continued)

*Primary Examiner* — Didarul A Mazumder
(74) *Attorney, Agent, or Firm* — XSENSUS LLP

(57) ABSTRACT

According to one embodiment, a display device includes a substrate, an insulating layer, a lower electrode, a rib, a partition, an upper electrode, an organic layer, a dam structure, and a conductive layer. The dam structure includes at least one convex portion disposed in a peripheral area between the end portion of the substrate and a display area. The upper electrode and the organic layer are also disposed in the peripheral area. End portions of the upper electrode and the organic layer are located between the dam structure and the display area in plan view. An end portion of the conductive layer is located between the end portions of the upper electrode and the organic layer and the display area in plan view, and is covered by the upper electrode and the organic layer.

11 Claims, 11 Drawing Sheets

(56) References Cited

FOREIGN PATENT DOCUMENTS

| | | | |
|---|---|---|---|
| JP | 2009-032673 | A | 2/2009 |
| JP | 2010-118191 | A | 5/2010 |
| WO | 2018/179308 | A1 | 10/2018 |

* cited by examiner

DISPLAY DEVICE COMPRISING ORGANIC LIGHT EMITTING DIODE (LED) INCLUDING CONVEX DAM STRUCTURE

CROSS-REFERENCE TO RELATED APPLICATION

This application is based upon and claims the benefit of priority from Japanese Patent Application No. 2023-032017, filed Mar. 2, 2023, the entire contents of which are incorporated herein by reference.

FIELD

Embodiments described herein relate generally to a display device.

BACKGROUND

Recently, display devices to which an organic light emitting diode (OLED) is applied as a display element have been put into practical use. The display element comprises a lower electrode, an organic layer which covers the lower electrode, and an upper electrode which covers the organic layer.

Generally, organic layers have low resistance to moisture. If moisture reaches an organic layer for some reason, it can be a contributing factor to a decrease in the display quality, such as a decrease in the luminance of the display element when emitting light. In addition, if moisture enters the drive circuits located in the peripheral areas surrounding the display area, the elements which constitute the drive circuits may deteriorate, resulting in malfunctions in the operation of the display device.

DETAILED DESCRIPTION

Figure 1:
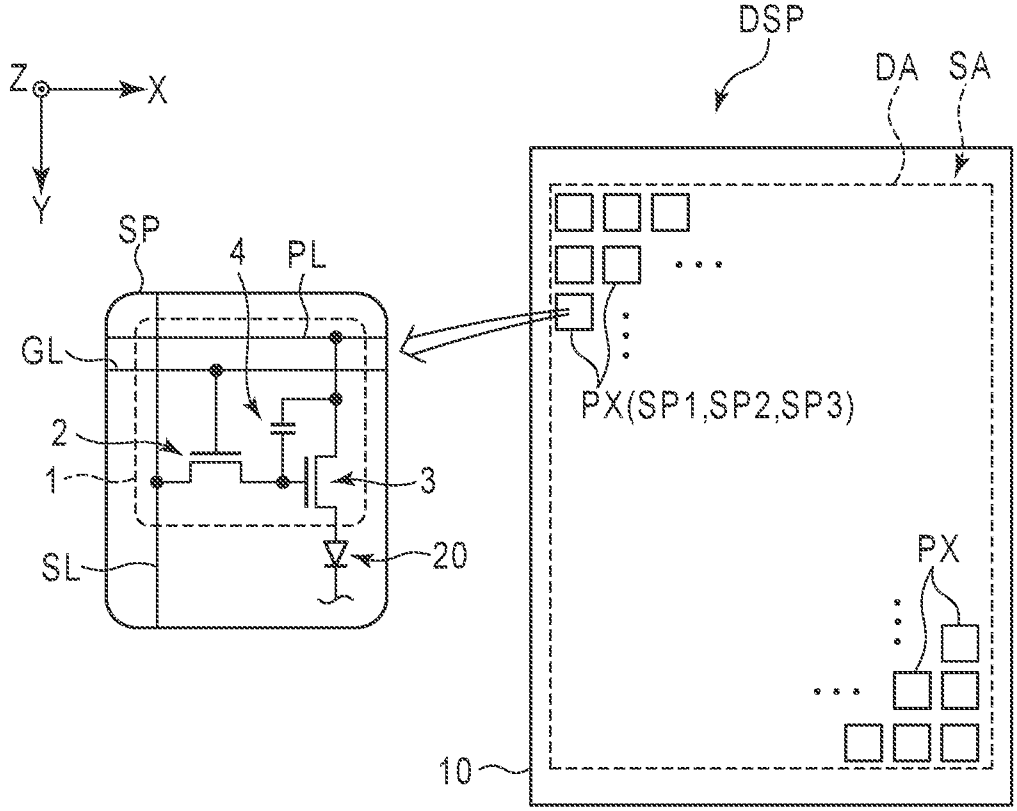
FIG. 1 is a diagram showing a configuration example of a display device according to an embodiment.

In general, according to one embodiment, a display device includes a substrate, an insulating layer, a lower electrode, a rib, a partition, an upper electrode, an organic layer, a dam structure, and a conductive layer. The insulating layer is disposed above the substrate. The lower electrode is disposed above the insulating layer in a display area including pixels. The rib includes an aperture overlapping the lower electrode. The partition is disposed above the rib in the display area. The upper electrode opposes the lower electrode and connected to the partition. The organic layer is disposed between the lower electrode and the upper electrode and emitting light according to a potential difference between the lower electrode and the upper electrode. The dam structure includes at least one convex portion disposed in the peripheral area between an end portion of the substrate and the display area. The conductive layer is disposed in the peripheral area and connected to the partition. The upper electrode and the organic layer are disposed in the peripheral area as well. End portions of the upper electrode and the organic layer are located between the dam structure and the display area in plan view. An end portion of the conductive layer is located between the end portions of the upper electrode and the organic layer and the display area in plan view, and is covered by the upper electrode and organic layer.

Embodiments will be described with reference to the accompanying drawings.

Note that the disclosure is merely an example, and proper changes in keeping with the spirit of the invention, which are easily conceivable by a person of ordinary skill in the art, come within the scope of the invention as a matter of course. In addition, in some cases, in order to make the description clearer, the drawings show schematic illustration rather than as an accurate representation of what is implemented. However, such schematic illustration is merely exemplary, and in no way restricts the interpretation of the invention. In addition, in the specification and drawings, structural elements which function in the same or a similar manner to those described in connection with preceding drawings are denoted by like reference numbers, detailed description thereof being omitted unless necessary.

In the drawings, in order to facilitate understanding, an X-axis, a Y-axis and a Z-axis orthogonal to each other are shown depending on the need. A direction parallel to the X-axis is referred to as a first direction. A direction parallel to the Y-axis is referred to as a second direction. A direction parallel to the Z-axis is referred to as a third direction. Further, viewing various elements in parallel with the third direction Z is referred to as planar view.

The display devices of the embodiments are each an organic electroluminescent display device comprising an organic light emitting diode (OLED) as a display element, and is mounted on televisions, personal computers, in-vehicle devices, tablet terminals, smartphones, mobile phones and the like.

FIG. 1 is a diagram showing a configuration example of a display device DSP according to the present embodiment. The display device DSP comprises, on an insulating substrate 10, a display area DA which displays images, and a peripheral area SA around the display area DA. The substrate 10 may be glass or a resinous film having flexibility.

In this embodiment, the shape of the substrate 10 in plan view is rectangular. However, the shape of the substrate 10 in plan view is not limited to rectangular, but may be some other shape such as a square, circle or oval.

The display area DA comprises a plurality of pixels PX arranged in a matrix along the first direction X and the second direction Y. Each of the pixels PX includes a plurality of subpixels SP. For example, the pixel PX includes a red subpixel SP1, a green subpixel SP2, and a blue subpixel SP3. Note that the pixel PX may include a subpixel SP of some other color, such as white, together with or in place of any of the subpixels SP1, SP2, and SP3.

The subpixel SP comprises a pixel circuit 1 and a display element 20 driven by the pixel circuit 1. The pixel circuit 1 comprises a pixel switch 2, a drive transistor 3, and a capacitor 4. The pixel switch 2 and the drive transistor 3 are switching elements constituted by thin-film transistors, for example.

A gate electrode of the pixel switch 2 is connected to a scanning line GL. One of source and drain electrodes of the pixel switch 2 is connected to a signal line SL, and the other is connected to a gate electrode of the drive transistor 3 and the capacitor 4. In the drive transistor 3, one of source and drain electrodes is connected to a power line PL and the capacitor 4, and the other is connected to the display element 20.

The display element 20 is an organic light emitting diode (OLED) as a light emitting element. For example, the subpixel SP1 comprises a display element 20 which emits light in a red wavelength range, the subpixel SP2 comprises a display element 20 which emits light in a green wavelength range, and the subpixel SP3 comprises a display element 20 which emits light in a blue wavelength range.

Note that the configuration of the pixel circuit 1 is not limited to that of the example shown in the figure. For example, the pixel circuit 1 may as well be provided with more thin-film transistors and capacitors.

Figure 2:
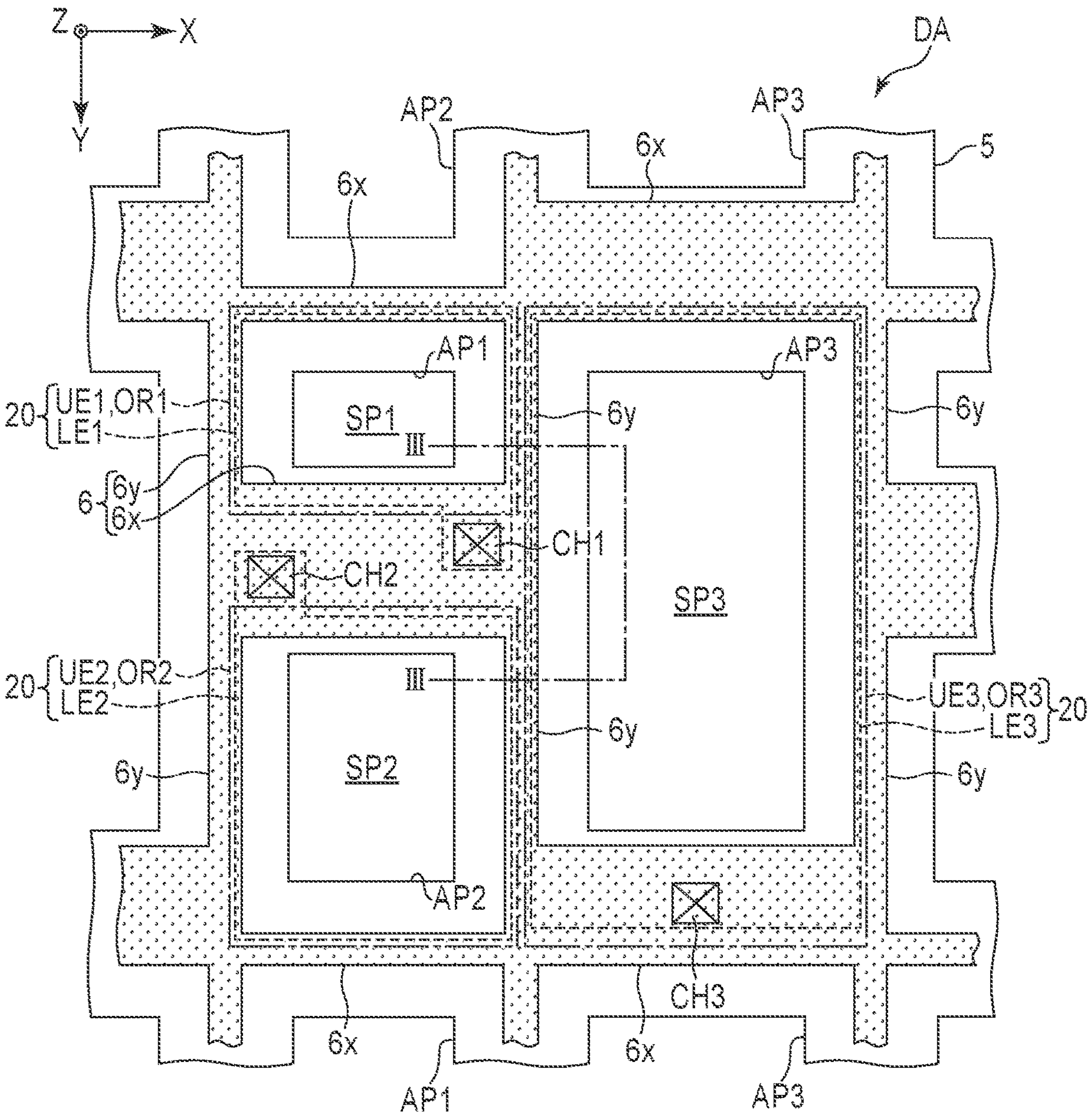
FIG. 2 is a diagram showing an example of layout of subpixels.

FIG. 2 is a diagram showing an example of layout of subpixels SP1, SP2, and SP3. In the example of FIG. 2, the subpixel SP1 and the subpixel SP2 are aligned along the second direction Y. Further, the subpixels SP1 and SP2 are each aligned with the subpixel SP3 along the first direction X.

When the subpixels SP1, SP2, and SP3 are arranged in such a layout, rows in which the subpixels SP1 and SP2 are arranged alternately along the second direction Y and rows in which a plurality of subpixels SP3 are arranged repeatedly along the second direction Y are formed in the display area DA. These rows are arranged alternately along the first direction X.

The layout of subpixels SP1, SP2, and SP3 is not limited to the example in FIG. 2. As another example, the subpixels SP1, SP2, SP3 in each pixel PX may be arranged in order along the first direction X.

A rib 5 and a partition 6 are disposed in the display area DA. The rib 5 comprises pixel apertures AP1, AP2, and AP3 in subpixels SP1, SP2, and SP3, respectively. In the example of FIG. 2, the pixel aperture AP2 is larger than the pixel aperture AP1, and the pixel aperture AP3 is larger than the pixel aperture AP2.

The partition 6 is disposed in the boundary between each adjacent pair of the subpixels SP and overlaps the rib 5 in plan view. The partition 6 includes a plurality of first partitions 6*x* extending along the first direction X and a plurality of second partitions 6*y* extending along the second direction Y. The plurality of first partitions 6*x* are each disposed between each respective pair of pixel apertures AP1 and AP2 adjacent to each other along the second direction Y and between each respective pair of pixel apertures AP3 adjacent to each other along the second direction Y. The second partitions 6*y* are each disposed between each pair of pixel apertures AP1 and AP3 adjacent to each other along the first direction X and between each pair of pixel apertures AP2 and AP3 adjacent to each other along the first direction X.

In the example of FIG. 2, the first partitions 6*x* and the second partitions 6*y* are connected to each other. In this manner, the partition 6 as a whole has a grid shape surrounding the pixel apertures AP1, AP2, and AP3. It can as well be said that the partition 6 comprises apertures in the subpixels SP1, SP2, and SP3 as in the case of the rib 5.

The subpixel SP1 comprises a lower electrode LE1, an upper electrode UE1, and an organic layer OR1, each of which overlaps the pixel apertures AP1. The subpixel SP2 comprises a lower electrode LE2, an upper electrode UE2, and an organic layer OR2, each of which overlaps the pixel aperture AP2. The subpixel SP3 comprises a lower electrode LE3, an upper electrode UE3, and an organic layer OR3, each of which overlaps the pixel aperture AP3. In the example of FIG. 2, the outer shapes of the upper electrode UE1 and the organic layer OR1 match each other, the outer shapes of the upper electrode UE2 and the organic layer OR2 match each other, and the outer shapes of the upper electrode UE3 and the organic layer OR3 match each other.

The lower electrode LE1, the upper electrode UE1 and the organic layer OR1 constitute the display element 20 of the subpixel SP1. The lower electrode LE2, the upper electrode UE2 and the organic layer OR2 constitute the display element 20 of the subpixel SP2. The lower electrode LE3, the upper electrode UE3, and the organic layer OR3 constitute the display element 20 of the subpixel SP3.

The lower electrode LE1 is connected to the pixel circuit 1 of the subpixel SP1 (see FIG. 1) via a contact hole CH1. The lower electrode LE2 is connected to the pixel circuit 1 of the subpixel SP2 via a contact hole CH2. The lower electrode LE3 is connected to the pixel circuit 1 of the subpixel SP3 via a contact hole CH3.

In the example of FIG. 2, the contact holes CH1 and CH2 entirely overlap a first partition 6*x* between the pixel apertures AP1 and AP2 adjacent to each other along the second direction Y. The contact hole CH3 entirely overlaps a first partition 6*x* between two pixel apertures AP3 adjacent to each other along the second direction Y. As another example, at least a part of the contact holes CH1, CH2 and CH3 may not overlap the respective first partition 6*x*.

Figure 3:
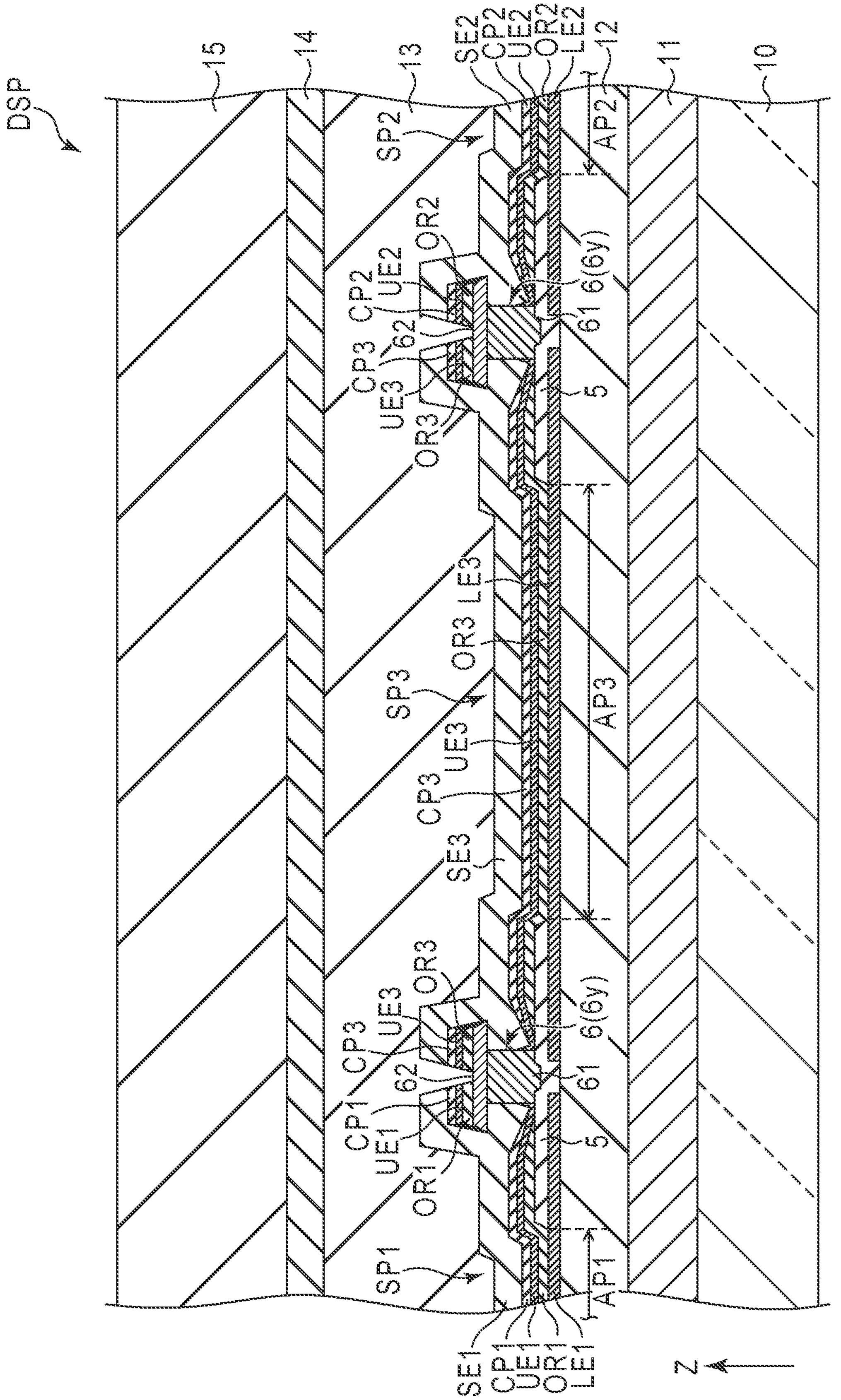
FIG. 3 is a cross-sectional view schematically showing the display device taken along line III-III in FIG. 2.

FIG. 3 is a cross-sectional view schematically showing the display device DSP taken along line III-III in FIG. 2. A circuit layer 11 is disposed on the substrate 10 described above. The circuit layer 11 includes various circuits and wiring lines, such as the pixel circuit 1, scanning lines GL, signal lines SL, and the power line PL shown in FIG. 1. The circuit layer 11 is covered by an organic insulating layer 12. The organic insulating layer 12 functions as a planarization film to planarize the unevenness caused by the circuit layer 11. Although not shown in the cross section of FIG. 3, the contact holes CH1, CH2, and CH3 described above are provided in the organic insulating layer 12.

The lower electrodes LE1, LE2, and LE3 are disposed on the organic insulating layer 12. The rib 5 is disposed on the organic insulating layer 12 and the lower electrodes LE1, LE2, and LE3. End portions of the lower electrodes LE1, LE2, LE3 are covered by the rib 5.

The partition 6 includes a conductive lower portion 61 disposed on the rib 5 and an upper portion 62 disposed on the lower portion 61. The upper portion 62 has a greater width than that of the lower portion 61. With this configuration, in FIG. 3, the respective end portions of the upper portion 62 protrude beyond respective side surfaces of the lower portion 61. Such a shape of the partition 6 may as well be referred to as an overhang shape.

The organic layer OR1 covers the lower electrode LE1 through the pixel aperture AP1. The upper electrode UE1 covers the organic layer OR1 and opposes the lower electrode LE1. The organic layer OR2 covers the lower electrode LE2 through the pixel aperture AP2. The upper electrode UE2 covers the organic layer OR2 and opposes the lower electrode LE2. The organic layer OR3 covers the lower electrode LE3 through the pixel aperture AP3. The upper electrode UE3 covers the organic layer OR3 and opposes the lower electrode LE3.

In the example of FIG. 3, a cap layer CP1 is disposed on the organic layer OR1, a cap layer CP2 is disposed on the organic layer OR2, and a cap layer CP3 is disposed on the organic layer OR3. The cap layers CP1, CP2, and CP3 adjust the optical properties of the light emitted by the organic layers OR1, OR2, and OR3, respectively.

Parts of the organic layer OR1, the upper electrode UE1 and the cap layer CP1 are located on the upper portion 62. These parts are separated from other parts of the organic layer OR1, the upper electrode UE1 and the cap layer CP1. Similarly, parts of the organic layer OR2, the upper electrode UE2 and the cap layer CP2 are located on the upper portion 62, and these parts are separated from other parts of the organic layer OR2, the upper electrode UE2 and the cap layer CP2. Further, parts of the organic layer OR3, the upper electrode UE3 and the cap layer CP3 are located on the upper portion 62, and these parts are separated from other parts of the organic layer OR3, the upper electrode UE3 and the cap layer CP3.

Sealing layers SE1, SE2, and SE3 are disposed in the subpixels SP1, SP2, and SP3, respectively. The sealing layer SE1 continuously covers the cap layer CP1 and the partition 6. The sealing layer SE2 continuously covers the cap layer CP2 and the partition 6. The sealing layer SE3 continuously covers the cap layer CP3 and the partition 6.

In the example of FIG. 3, the organic layer OR1, the upper electrode UE1, the cap layer CP1 and the sealing layer SE1 on a part of the partition wall 6 between the subpixels SP1 and SP3 are respectively separated from the organic layer OR3, the upper electrode UE3, the cap layer CP3 and the sealing layer SE3 on the portion of the partition wall 6. In addition, the organic layer OR2, the upper electrode UE2, the cap layer CP2, and the sealing layer SE2 on a part of the partition 6 between the subpixels SP2 and SP3 are respectively separated from the organic layer OR3, the upper electrode UE3, the cap layer CP3, and the sealing layer SE3 on the part of the partition 6.

The sealing layers SE1, SE2, and SE3 are covered by a resin layer 13. The resin layer 13 is covered by a sealing layer 14. Further, the sealing layer 14 is covered by a resin layer 15.

The organic insulating layer 12 and the resin layers 13 and 15 are formed of organic materials. The ribs 5 and the sealing layers 14, SE1, SE2, and SE3 are formed of an inorganic material such as silicon nitride ($SiN_x$). The rib 5 and the sealing layers 14, SE1, SE2, and SE3 may as well be formed as a single layer of one of silicon oxide ($SiO_x$), silicon oxynitride (SiON) or aluminum oxide ($Al_2O_3$). The rib 5 and the sealing layers 14, SE1, SE2, and SE3 may be formed as a stacked body of a combination of at least two of a silicon nitride layer, a silicon oxide layer, a silicon oxynitride layer and an aluminum oxide layer.

The upper electrodes UE1, UE2, and UE3 are formed of a metal material, such as an alloy of magnesium and silver (MgAg). When the potential of the lower electrodes LE1, LE2, and LE3 is relatively higher than that of the upper electrodes UE1, UE2, and UE3, the lower electrodes LE1, LE2, and LE3 are equivalent to anodes and the upper electrodes UE1, UE2, and UE3 are equivalent to cathodes. On the other hand, when the potential of the upper electrodes UE1, UE2, and UE3 is relatively higher than that of the lower electrodes LE1, LE2, and LE3, the upper electrodes UE1, UE2, UE3 are equivalent to the anodes and the lower electrodes LE1, LE2, and LE3 are equivalent to the cathodes.

The organic layers OR1, OR2, and OR3 include a pair of functional layers and a light-emitting layer positioned between these functional layers. For example, the organic layers OR1, OR2 and OR3 have a structure in which a hole injection layer, a hole transport layer, an electron blocking layer, an emission layer, a hole blocking layer, an electron transport layer and an electron injection layer are stacked in order.

The cap layers CP1, CP2, and CP3 are formed, for example, by a multilayer of a plurality of transparent thin films. The multilayers may include, as the plurality of thin films, thin films formed of inorganic materials and thin films formed of organic materials. These plurality of thin films have refractive indices different from each other. The materials of the thin films which constitute the plurality of layers are different from the materials of the upper electrodes UE1, UE2, and UE3, and also from the materials of the sealing layers SE1, SE2, and SE3. Note that the cap layers CP1, CP2, and CP3 may be omitted.

A common voltage is supplied to the partition 6. The common voltage is supplied to each of the upper electrodes UE1, UE2, and UE3, which are in contact with the side surfaces of the lower portion 61. To the lower electrodes LE1, LE2, LE3, pixel voltages are supplied via through the respective pixel circuits 1 of the subpixels SP1, SP2, and SP3.

When a potential difference is created between the lower electrode LE1 and the upper electrode UE1, the light-emitting layer of the organic layer OR1 emits light in the red wavelength range. When a potential difference is created between the lower electrode LE2 and the upper electrode UE2, the light-emitting layer of the organic layer OR2 emits light in the green wavelength range. When a potential difference is created between the lower electrode LE3 and the upper electrode UE3, the light-emitting layer of the organic layer OR3 emits light in the blue wavelength range.

Next, the structure that can be applied to the peripheral area SA will be described.

Figure 4:
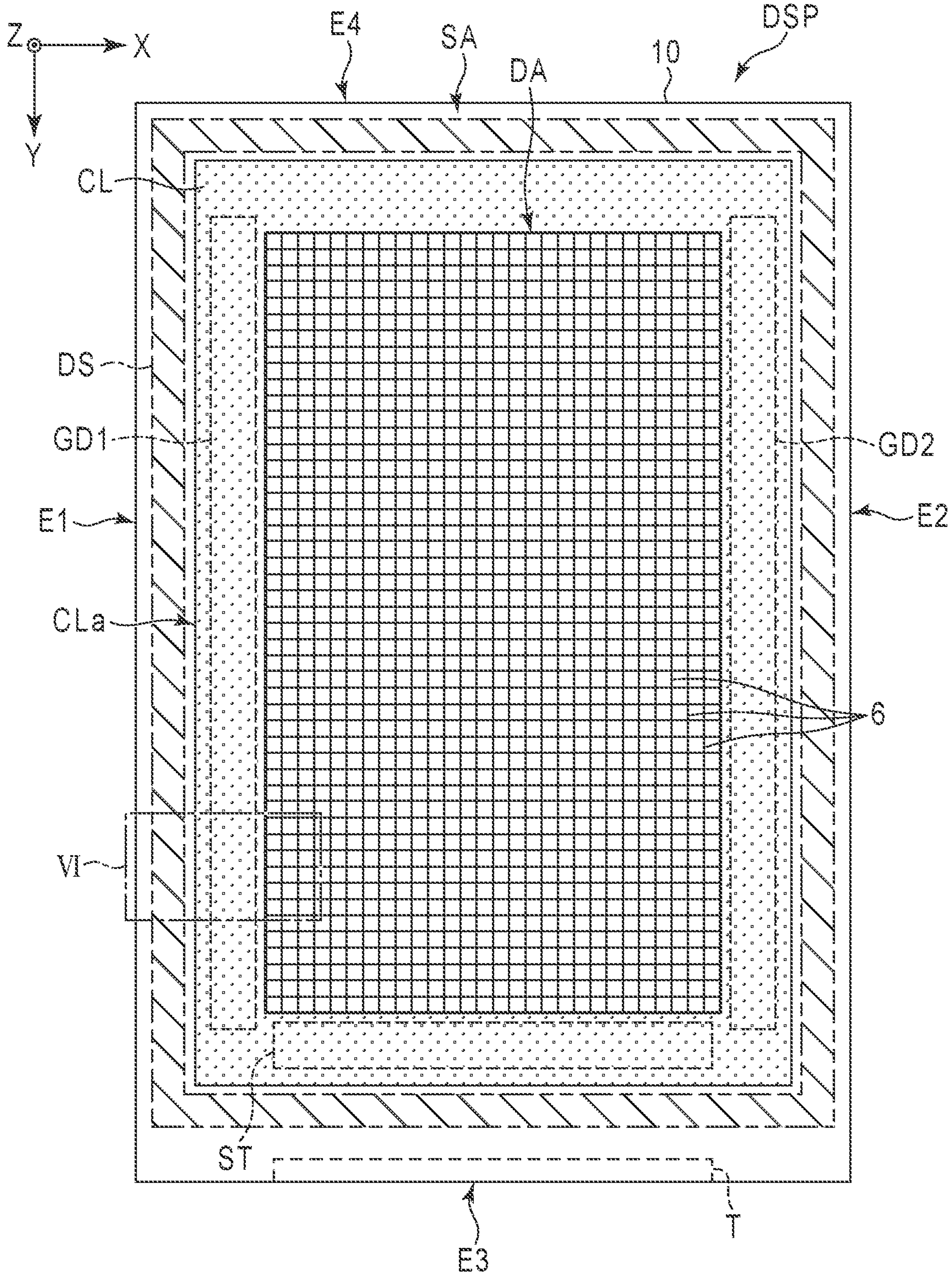
FIG. 4 is a plan view schematically showing some elements of the display device.

FIG. 4 is a plan view schematically showing the display device DSP. The display device DSP comprises a first gate drive circuit GD1, a second gate drive circuit GD2, a selector circuit ST, and a terminal portion T as elements arranged in the peripheral area SA. The first gate drive circuit GD1, the second gate drive circuit GD2, and the selector circuit ST are examples of drive circuits that supply signals to the pixel circuit 1, respectively, and are included in the circuit layer 11 shown in FIG. 3.

The first gate drive circuit GD1 and the second gate drive circuit GD2 supply scanning signals to the scanning lines GL shown in FIG. 1. To the terminal portion T, a flexible circuit board, for example, is connected. The selector circuit ST supplies video signals input from the flexible circuit board to signal lines SL shown in FIG. 1.

The substrate 10 includes a first end portion E1, a second end portion E2, a third end portion E3 and a fourth end portion E4. The first end portion E1 and the second end portion E2 extend parallel to the second direction Y. The third end portion E3 and the fourth end portion E4 extend parallel to the first direction X.

In the example of FIG. 4, the first gate drive circuit GD1 is located between the display area DA and the first end portion E1, the second gate drive circuit GD2 is located between the display area DA and the second end portion E2, and the selector circuit ST and the terminal portion T are located between the display area DA and the third end portion E3.

Further, the display device DSP is provided with a conductive layer CL (portion with a dotted pattern) and a dam structure DS (portion with a shaded pattern), located in the peripheral area SA. In the example in FIG. 4, the conductive layer CL surrounds the display area DA. Furthermore, the dam structure DS surrounds the conductive layer CL. The dam structure DS, for example, serves to dam the resin layer 13 shown in FIG. 3.

The conductive layer CL is connected to the partition 6 disposed in the display area DA. The conductive layer CL overlaps the first gate drive circuit GD1, the second gate drive circuit GD2 and the selector circuit ST in plan view.

Note that the conductive layer CL does not necessarily need to have a shape that surrounds the display area DA. For example, the conductive layer CL may not be located between the display area DA and the third end portion E3 or between the display area DA and the fourth end portion E4.

Figure 5:
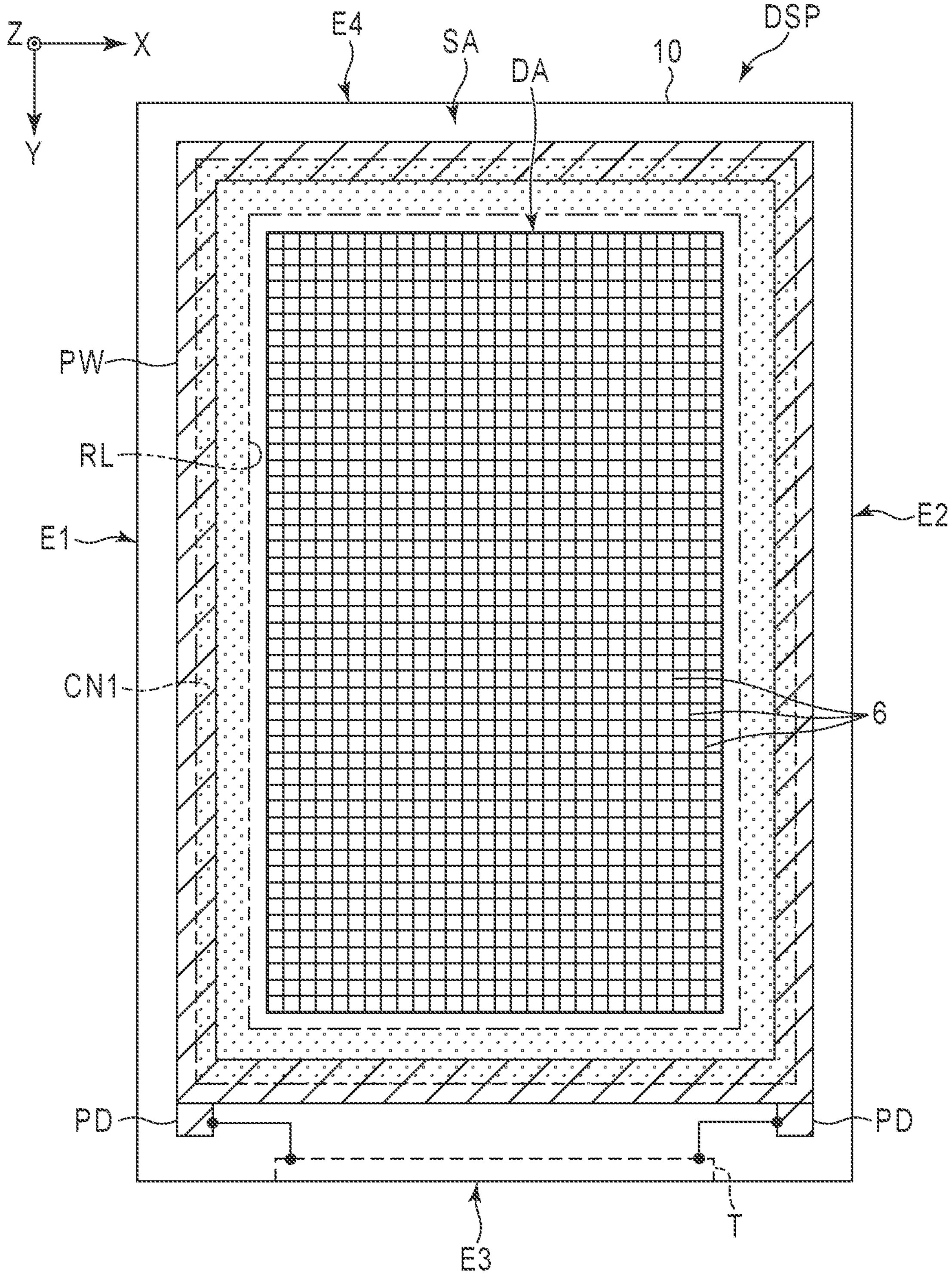
FIG. 5 is a plan view schematically showing other elements of the display device.

FIG. 5 is a schematic plan view showing other elements disposed in the peripheral area SA. In the peripheral area SA, a power feed line PW (portion with a shaded pattern) and a relay wiring line RL (portion with a dotted pattern) are disposed.

In FIG. 5, the power feed line PW and the relay wiring line RL surround the display area DA, but the configuration is not limited to that of this example. The power feed line PW and the relay wiring line RL partially overlap each other.

The power feed line PW includes a pair of pads PD located near the third end portion E3. These pads PD are electrically connected to the terminal portion T. A common voltage is supplied to the power feed line PW via the terminal portion T and each pad PD. Further, the common voltage of the power feed line PW is supplied to the relay wiring line RL.

Figure 6:
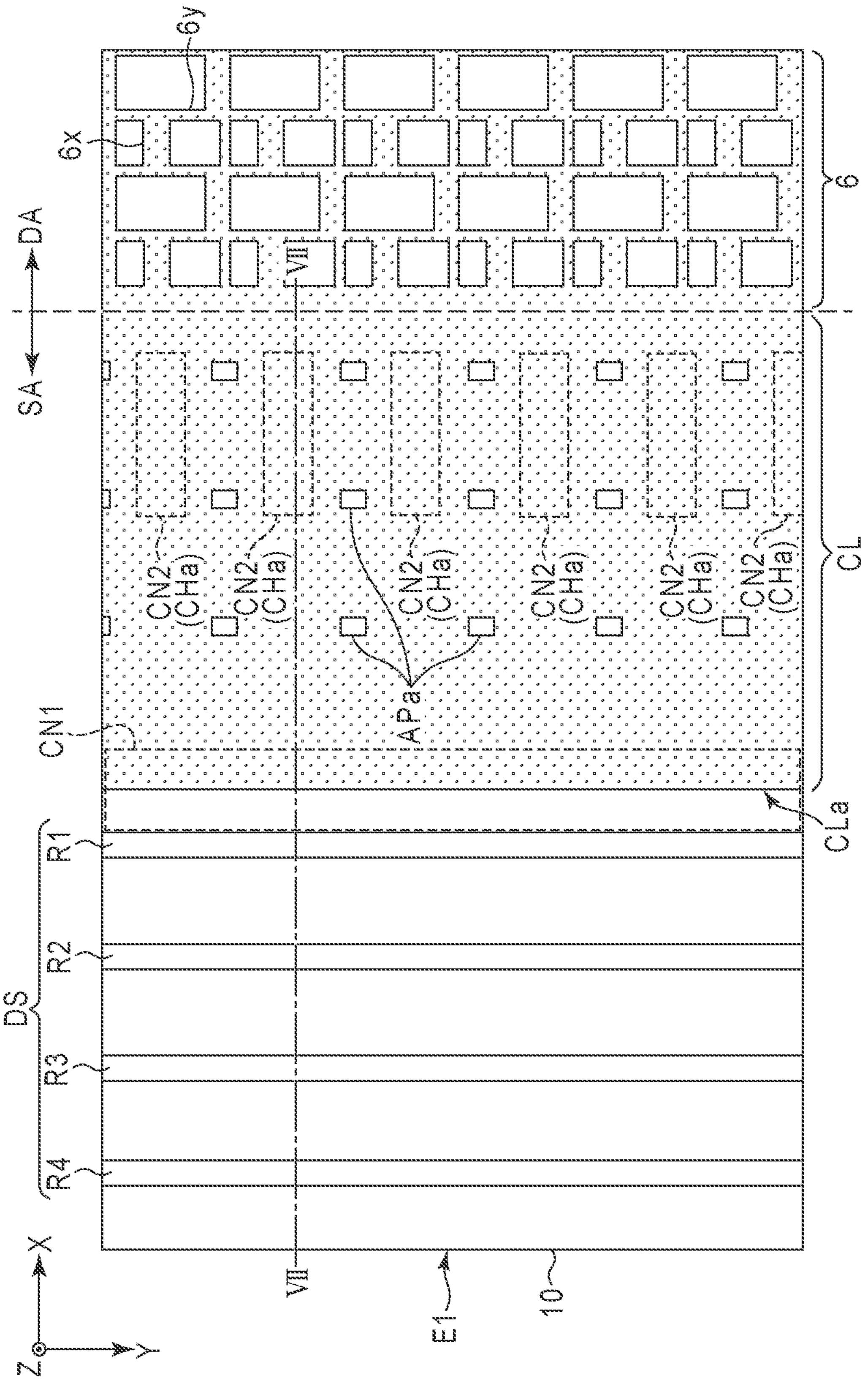
FIG. 6 is an enlarged view of the area enclosed by the chain line frame in FIG. 4.
Figure 7:
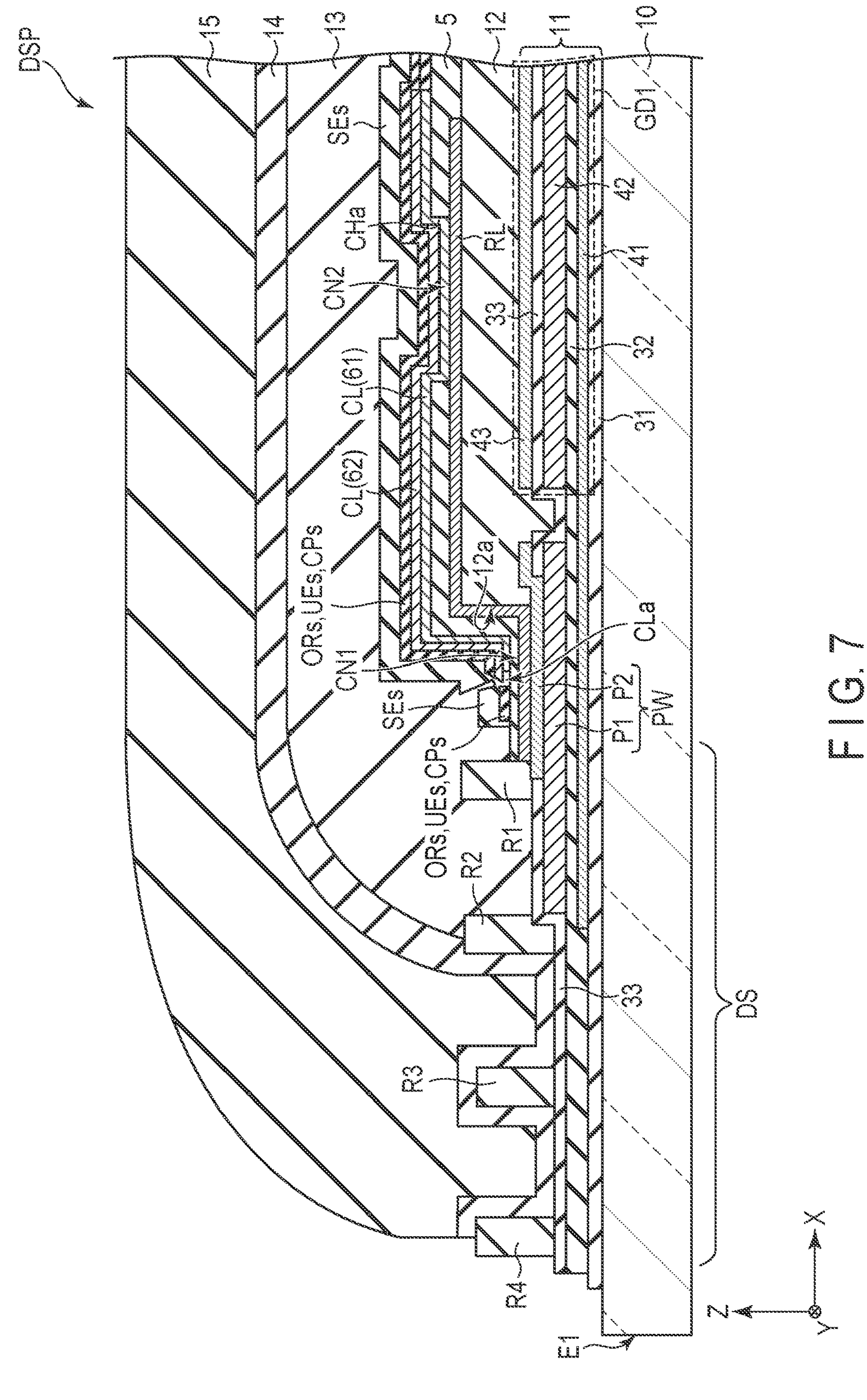
FIG. 7 is a cross-sectional view schematically showing the display device along line VII-VII in FIG. 6.

FIG. 6 is an enlarged view of the area enclosed by the chained frame VI in FIG. 4. FIG. 7 is a cross-sectional view schematically showing the display device DSP taken along line VII-VII in FIG. 6. The areas with dot patterns in FIG. 6 correspond to the conductive layer CL and the partition 6 (the first partitions 6*x* and the second partitions 6*y*). The conductive layer CL and the partition 6 are formed to be integrated as one body by the same manufacturing process using the same material.

As shown in FIGS. 6 and 7, the dam structure DS includes a first convex portion R1, a second convex portion R2, a third convex portion R3 and a fourth convex portion R4. The first convex portion R1 encloses the display area DA, the second convex portion R2 encloses the first convex portion R1, the third convex portion R3 encloses the second convex portion R2, and the fourth convex portion R4 encloses the third convex portion R3. The number of convex portions of the dam structure DS is not limited to four, but may be three or less or five or more.

As shown in FIG. 7, the convex portions R1, R2, R3, R4 are located between an end portion 12*a* of the organic insulating layer 12 and the first end portion E1 of the substrate 10. The convex portions R1, R2, R3, R4 are located between the end portion 12*a* and the second end portion E2, between the end portion 12*a* and the third end portion E3, and between the end portion 12*a* and the fourth end portion E4, as well. The convex portions R1, R2, R3, and R4 are formed by the same manufacturing process using the same material as those of the organic insulating layer 12, for example.

The interval between any two of convex portions R1, R2, R3 and R4 adjacent to each other is larger than the width of each of the convex portions R1, R2, R3, and R4. For example, the width of each of the convex portions R1, R2, R3, and R4 is 15 to 25 μm, and the interval between any two of convex portions R1, R2, R3, and R4 adjacent to each other is 25 to 35 μm. The height of each of the convex portions R1, R2, R3, and R4 is 3 to 4 μm.

In the example of FIG. 7, the circuit layer 11 comprises insulating layers 31, 32, and 33, and metal layers 41, 42, and 43. The insulation layer 31 covers the substrate 10. The metal layer 41 is disposed on the insulating layer 31 and covered by the insulating layer 32. The metal layer 42 is disposed on the insulating layer 32 and covered by the insulating layer 33. The metal layer 43 is disposed on the insulating layer 33 and covered by the organic insulating layer 12.

The insulating layers 31, 32 and 33 are each formed of an inorganic material such as silicon nitride or silicon oxide. The metal layers 41, 42, and 43 have a single-layer of a metal material such as molybdenum (Mo), tungsten (W), molybdenum-tungsten alloy (MoW), aluminum (Al) or copper (Cu), or of a stacked-layer structure of any combination of these metals.

The first gate drive circuit GD1 is formed of the metal layers 41, 42 and 43 and semiconductor layers. The second gate drive circuit GD2 and the selector circuit ST shown in FIG. 4 and the pixel circuit 1 shown in FIG. 1 are similarly formed of the metallic layers 41, 42, and 43 and semiconductor layers. The scanning lines GL, the signal lines SL, and the power line PL shown in FIG. 1 as well are formed of any one of the metal layers 41, 42, and 43.

The convex portions R1, R2, R3, R4 are disposed on the insulating layer 33. The rib 5 is disposed on the peripheral area SA as well. As shown in FIG. 7, the rib 5 is brought into contact with the side surface of the first convex part R1 and covers the relay wiring line RL. With this configuration, it is possible to prevent the relay wiring line RL and the power feed line PW from being damaged in the process of forming the conductive layer CL and the partition 6.

The conductive layer CL includes a lower portion 61 and an upper portion 62 as in the case of the partition 6 shown in FIG. 3. In the conductive layer CL as well, the end portion of the upper portion 62 protrudes beyond the side surface of the lower portion 61.

As shown in FIG. 7, an end portion CLa of the conductive layer CL is located between the end portion 12*a* of the organic insulating layer 12 and the first convex portion R1. In other words, as shown in FIG. 6, the end portion CLa of the conductive layer CL is located between the display area DA and the first convex portion R1.

The end portion CLa of the conductive layer CL is located between the end portion 12*a* of the organic insulating layer 12 and the first convex portion R1 all around the circumference thereof. In other words, as shown in FIG. 4, the end portion CLa is located on an inner side the dam structure DS over the entire circumference. As shown in FIG. 4, the end CLa is located between the first gate drive circuit GD1 and the dam structure DS, between the second gate drive circuit GD2 and the dam structure DS, and between the selector circuit ST and the dam structure DS.

In the example of FIG. 7, the power feed line PW (first feed line) includes a first portion P1 formed from the metal layer 42 and a second portion P2 formed from the metal layer 43. The second portion P2 is in contact with the first portion P1. For example, in the power feed line PW shown in FIG. 5, the pad PD is formed from the first portion P1, and the portion surrounding the display area DA is formed from at least the second portion P2.

The relay wiring line RL is mostly located on the organic insulating layer 12 and covered by the rib 5. The relay wiring line RL is formed of the same material and by the same manufacturing process as those of the lower electrodes LE1, LE2, and LE3.

The relay wiring line RL is connected to the power feed line PW at a first contact portion CN1 and to the conductive layer CL at a second contact portion CN2. With this configuration, the common voltage of the feed line PW is supplied to the conductive layer CL via the relay wiring line RL. Further, the common voltage of the conductive layer CL is supplied to the partition 6 and the upper electrodes UE1, UE2, and UE3 in the display area DA.

The first contact portion CN1 is located between the end portion 12*a* of the organic insulating layer 12 and the first convex portion R1. In the first contact portion CN1, a lower surface of the relay wiring line RL is in contact with the second portion P2 of the feed line PW, and an upper surface of the relay wiring line RL is covered by the rib 5.

The first contact portion CN1 is equivalent to the area where the power feed line PW and the relay wiring line RL overlap in FIG. 5, for example, and surrounds the display area DA. Note, however, that the first contact portion CN1 may be discontinuous at least at one site around the display area DA.

As shown in FIGS. 6 and 7, the second contact portion CN2 comprises a plurality of contact holes CHa provided in the rib 5. The lower portion 61 of the conductive layer CL is brought into contact with the upper surface of the relay wiring line RL via these contact holes CHa.

In the example of FIG. 6, these contact holes CHa each extend long along the first direction X and are aligned along the second direction Y. The shape and arrangement of the contact holes CHa are not limited to those of this example, but can be modified in various ways.

As shown in FIG. 6, the second contact portion CN2 is located between the first contact portion CN1 and the display area DA in plan view. The end portion CLa of the conductive layer CL overlaps the first contact portion CN1 in plan view and is separated from the first convex portion R1. The end portion CLa of the conductive layer CL overlaps the first contact portion CN1 in plan view and is separated from the first convex portion R1 in plan view all around the circumference thereof.

The conductive layer CL comprises a plurality of apertures APa aligned at regular intervals along the first direction X as well as the second direction Y. In the example of FIG. 6, some of these apertures APa are located between each pair of contact holes CHa adjacent to each other along the second direction Y. The apertures APa are smaller in size than the contact holes CHa in plan view, for example.

When forming the conductive layer CL and the partition 6, base layers, which give rise to the lower portion 61 and the upper portion 62, are first formed in the display area DA and the peripheral area SA, entirely, and these layers are patterned into the shape of the conductive layer CL and the partition 6 by etching. In the display area DA, there are many apertures (areas surrounded by the first and second partitions 6*x* and 6*y*) corresponding respectively to the subpixel SP1, SP2, and SP3. If the density of such apertures differs between the display area DA and the peripheral area SA, it may not be possible to achieve uniform etching progress. As a solution to this, a plurality of apertures APa may be provided in the conductive layer CL, and thus the etching progress can be made uniform between the display area DA and the peripheral area SA.

As shown in FIG. 7, an organic layer ORs, an upper electrode UEs, a cap layer CPs, and a sealing layer SEs (first sealing layer) are arranged in the peripheral area SA. Although the organic layer ORs, the upper electrode UEs and the cap layer CPs are shown as one layer in the example of FIG. 7, in reality, the upper electrode UEs covers the organic layer ORs and the cap layer CPs covers the upper electrode UEs. The organic layer ORs, the upper electrode UEs and the cap layer CPs cover the conductive layer CL. The sealing layer SEs covers the organic layer ORs, the upper electrode UEs and the cap layer CPs. The end portion of the sealing layer SEs covers the end portions of the organic layers ORs, the upper electrode UEs, and the cap layer CPs in plan view. As shown in FIG. 7, the organic layer ORs, the upper electrode UEs, and the cap layer CPs are divided by the upper portion 62 of the end portion CLa of the conductive layer CL, and therefore the organic layer ORs, the upper electrode UEs, and the cap layer CPs are placed to the end portion CLa of the conductive layer CL and once interrupted. Here, at least the organic layers ORs, the upper electrode UEs, and the cap layer CPs are not placed on the side surface of the lower portion 61 of the conductive layer CL, and at least part of the lower side of the upper portion 62 (the side connected to the lower portion 61) and the side surface of the lower portion 61 is in contact with the sealing layer SEs. The organic layers ORs, the upper electrode UEs, and the cap layer CPs located on an outer side of the end portion CLa of the conductive layer CL, are covered by the sealing layer SEs on the rib 5, and the end portions of the organic layers ORs, the upper electrode UEs, the cap layer CPs and the sealing layer SEs are located between the end portion CLa of the conductive layer CL and the first convex part R1. In other words, the organic layer ORs, the upper electrode UEs, and the cap layer CPs located on the upper portion 62 of the conductive layer CL and the organic layer ORs, the upper electrode UEs, and the cap layer CPs located on the rib 5 are divided in the area of the lower side of the upper portion 62 the end portion CLa of the conductive layer CL and the lower portion 61. Here, these parts are independent from each other and electrically and physically insulated from each other by the sealing layer SEs. Therefore, the outermost circumferential end portions of the organic layer ORs, the upper electrode UEs, the cap layer CPs and the sealing layer SEs are located between the display area DA and the first convex portion R1. The end portions of the organic layer ORs, the upper electrode UEs, the cap layer CPs and the sealing layer SEs are located between the end portion CLa of the conductive layer CL and the first convex portion R1 all around the entire circumference.

The organic layer ORs is formed by the same manufacturing process and of the same material as those of any of the organic layers OR1, OR2, and OR3. The upper electrode UEs is formed by the same manufacturing process and of the same material as those of any one of the upper electrodes UE1, UE2, and UE3. The cap layer CPs is formed by the same manufacturing process and of the same material as those of any one of the cap layers CP1, CP2 and CP3. The sealing layer SEs is formed by the same manufacturing process and of the same material as those of any one of the sealing layers SE1, SE2, and SE3. For example, the organic layer ORs, the upper electrode UEs, the cap layer CPs, and the sealing layer SEs are formed by the same manufacturing process and of the same material as those of the organic layer OR3, the upper electrode UE3, the cap layer CP3, and the sealing layer SE3, respectively.

The resin layer 13 (first resin layer) is formed, for example, by an ink-jet method. The unevenness of the sealing layer SEs, created by the convex portions R1, R2, R3, and R4 suppresses the spreading of the resin layer 13 before curing. In FIG. 7, the end portion of the resin layer 13 is located near the second convex portion R2, but the configuration is not limited to that of this example. The resin layer 13 covers the organic layer ORs, the upper electrode UEs, the cap layer CPs, and the sealing layer SEs. The sealing layer 14 (second sealing layer) covers the resin layer 13. The sealing layer 14 is in contact with the insulating layer 33 and the dam structure DS on an outer side of the end portion of the resin layer 13. The resin layer 15 (second resin layer) covers the sealing layer 14 in its entirety. The end portion of the sealing layer 14 and the end portion of the resin layer 15 overlap each other in plan view.

Note that, in FIGS. 6 and 7, the configuration between the display area DA and the first end portion E1 is focused, and a configuration similar to this can be applied to between the display area DA and the second end portion E2, between the display area DA and the third end portion E3, and between the display area DA and the fourth end portion E4.

In the display device DSP of the above-described embodiment, the partition 6 disposed in the display area DA is connected to the conductive layer CL disposed in the peripheral area SA. Further, the partition 6 is connected to the upper electrodes UE1, UE2, and UE3 of the subpixels SP1, SP2, and SP3, and the conductive layer CL is connected to the power feed line PW. In such a configuration, the common voltage of the feed line PW can be supplied to the upper electrodes UE1, UE2, and UE3 via the conductive layer CL and the partition 6.

In the following descriptions, advantageous effects of the display device DSP of this embodiment will be explained using comparative examples. Note that the comparative examples are intended to illustrate some of the effects that the display device DSP can exhibit, and do not exclude the configurations and effects common to the present embodiment and the comparative examples from the scope of the present invention.

Figure 8:
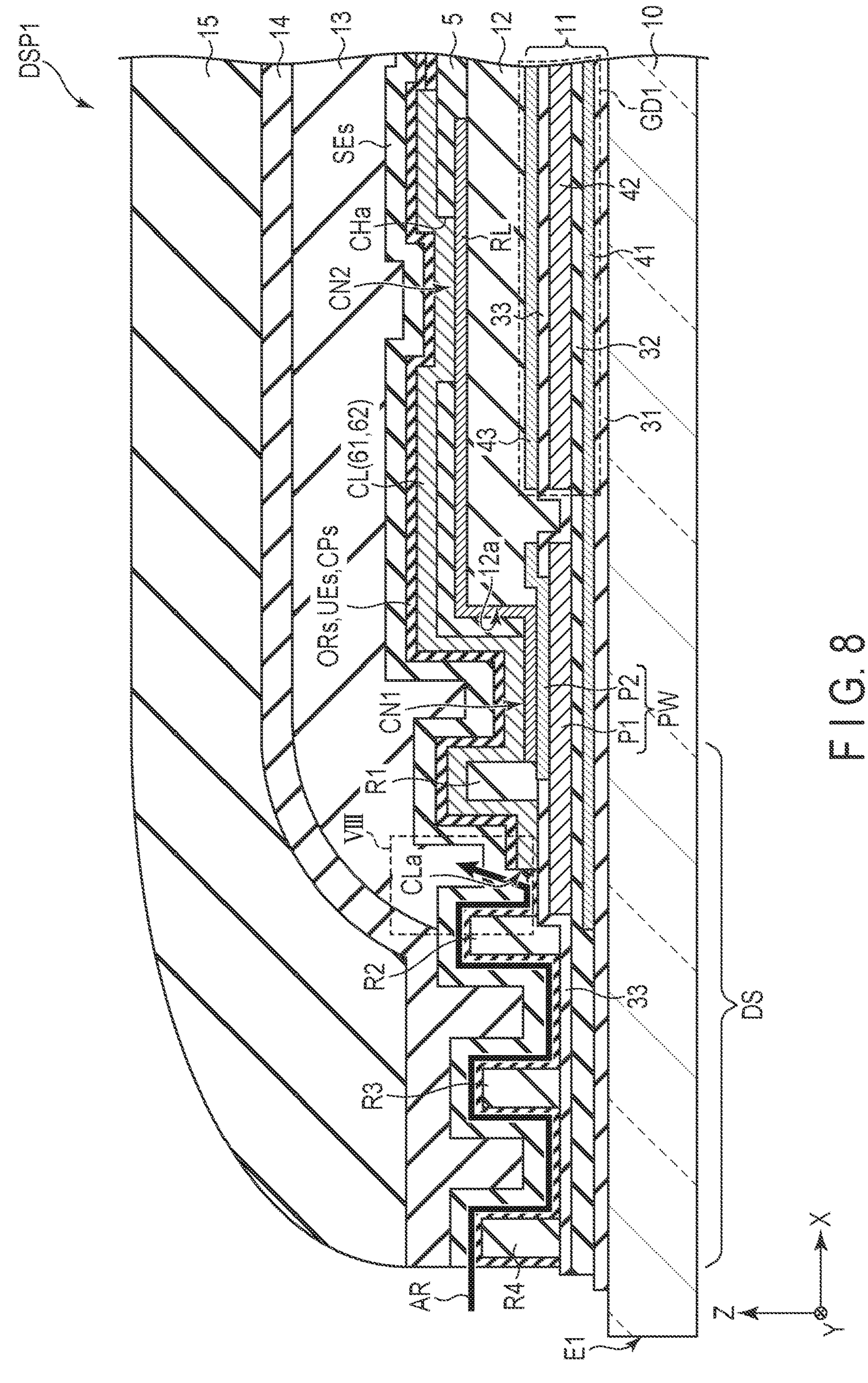
FIG. 8 is a cross-sectional view schematically showing a display device according to a comparative example.

FIG. 8 is a cross-sectional view schematically showing a display device DSP1 according to a comparative example. Although only the configuration between the display area DA and the first end portion E1 is shown in FIG. 8, the display device DSP1 includes a similar configuration between the display area DA and the second end portion E2, between the display area DA and the third end portion E3, and between the display area DA and the fourth end portion E4.

The display device DSP1 of the comparative example is different from the display device DSP of the embodiment mainly in the following two points: (1) the organic layers ORs, the upper electrode UEs and the cap layer CPs are arranged to cover the dam structure DS and are exposed to the outside, and (2) the end portion CLa of the conductive layer CL is located between the first convex part R1 of the dam structure DS and the end portions E1, E2, E3, and E4 of the substrate 10.

When, as in the case of the display device DSP1 of the comparative example, the organic layer ORs, the upper electrode UEs and the cap layer CPs are arranged in the peripheral area SA so as to cover the dam structure DS and exposed to the outside, there is a possibility that moisture may enter the display device DSP1 through these layers. If such moisture reaches the gate drive circuits GD1 and GD2, the selector circuit ST, the power feed line PW, the pixel circuit 1 and the display element 20, etc., operation error of the display device DSP1 may occur.

Here, in the display device DSP1 of the comparative example, as shown in FIG. 8, the end portion CLa of the conductive layer CL is placed between the first convex part R1 of the dam structure DS and the end portions E1, E2, E3, and E4 of the substrate 10, and thus the organic layer ORs, the upper electrode UEs and the cap layer CPs are divided by the end portion CLa, to suppress the entering of moisture to the inside of the display device DSP1.

However, in the display device DSP1 of the comparative example, if a defect (such as a crack) occurs in the sealing layer SEs in the area surrounded by the chain line frame VIII in FIG. 8, for example, moisture that has penetrated from the outside through the organic layer ORs, the upper electrode UEs and the cap layer CPs to the end portion CLa of the conductive layer CL may enter the display device DSP1 from such a defect in the sealing layer SEs (see arrow AR in FIG. 8).

By contrast, in the display device DSP of this embodiment, the end portion CLa of the conductive layer CL, and the end portions of the organic layer ORs, the upper electrode UEs, the cap layer CPs and the sealing layer SEs are located between the end portion 12*a* of the organic insulating layer 12 and the first convex portion R1 in plan view. In other words, the end portion CLa of the conductive layer CL, and the end portions of the organic layer ORs, the upper electrode UEs, the cap layer CPs, and the sealing layer SEs are located between the display area DA and the first convex portion R1 in plan view. Further, the conductive layer CL is covered by the organic layer ORs, the upper electrode UEs, the cap layer CPs, and the sealing layer SEs, and the organic layer ORs, the upper electrode UEs, the cap layer CPs, and the sealing layer SEs are covered by the resin layer 13.

With this configuration, the organic layer ORs, the upper electrode UEs, and the cap layer CPs, which may serve as a moisture penetration path, are not exposed to the outside, and therefore it is possible to suppress moisture penetration to the inside of the display device DSP through these layers. In addition, since the organic layer ORs, the upper electrode UEs, and the cap layer CPs are separated from each other by the end portion CLa of the conductive layer CL, moisture penetration to the inside of the display device DSP through these layers can be further suppressed. As a result, the resistance of the display device DSP to moisture is improved. Further, in the display device DSP of this embodiment, even if a defect occurs in a part of the sealing layer SEs, there is no path for moisture to possibly enter the inside of the display device DSP from the outside, and thus moisture will not enter the inside of the display device DSP due to defects in the sealing layer SEs.

Figure 9:
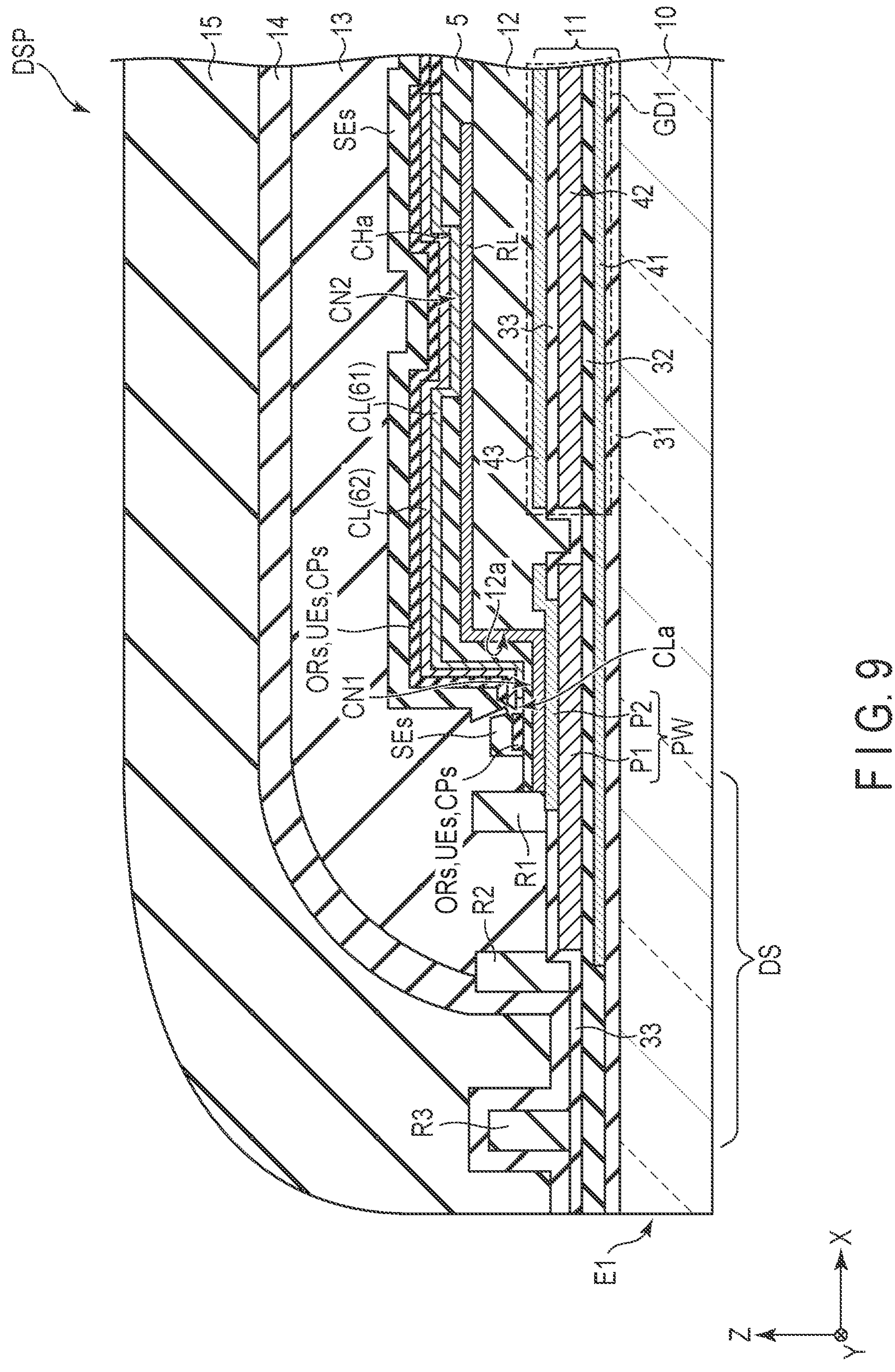
FIG. 9 is a cross-sectional view schematically showing a display device according to a modified example of the embodiment.

Note that in this embodiment, as can be seen from FIG. 7, the structure in which the end portion E1 of the substrate 10 and the end portions of the sealing layer 14 and the resin layer 15 do not overlap in plan view is discussed. But the display device DSP may have a structure in which the end portion E1 of the substrate 10 and the end portions of the sealing layer 14 and the resin layer 15 overlap in plan view as shown in FIG. 9. In other words, the display device DSP may be cut at any position (for example, between the second convex part R2 and the third convex part R3 in FIG. 7, between the third convex part R3 and the fourth convex part R4 in FIG. 7, etc.) in the peripheral area SA, as long as it is a position where the sealing layer 14 and the insulation layer 33 are in contact with each other. According to this, it is possible to realize a narrower frame of the display device DSP. Further, even in this case, the organic layer ORs, the upper electrode UEs, and the cap layer CPs, which can be a pathway for moisture to enter, are not exposed to the outside, advantageous effects similar to those described above can be obtained.

Further, the structure in which the end portion CLa of the conductive layer CL and the end portions of the organic layers ORs, the upper electrode UEs, the cap layer CPs and the sealing layer SEs are placed between the end portion 12*a* of the organic insulating layer 12 and the first convex part R1 is applicable to such a case where the display device DSP has the so-called touch panel function as well.

Figure 10:
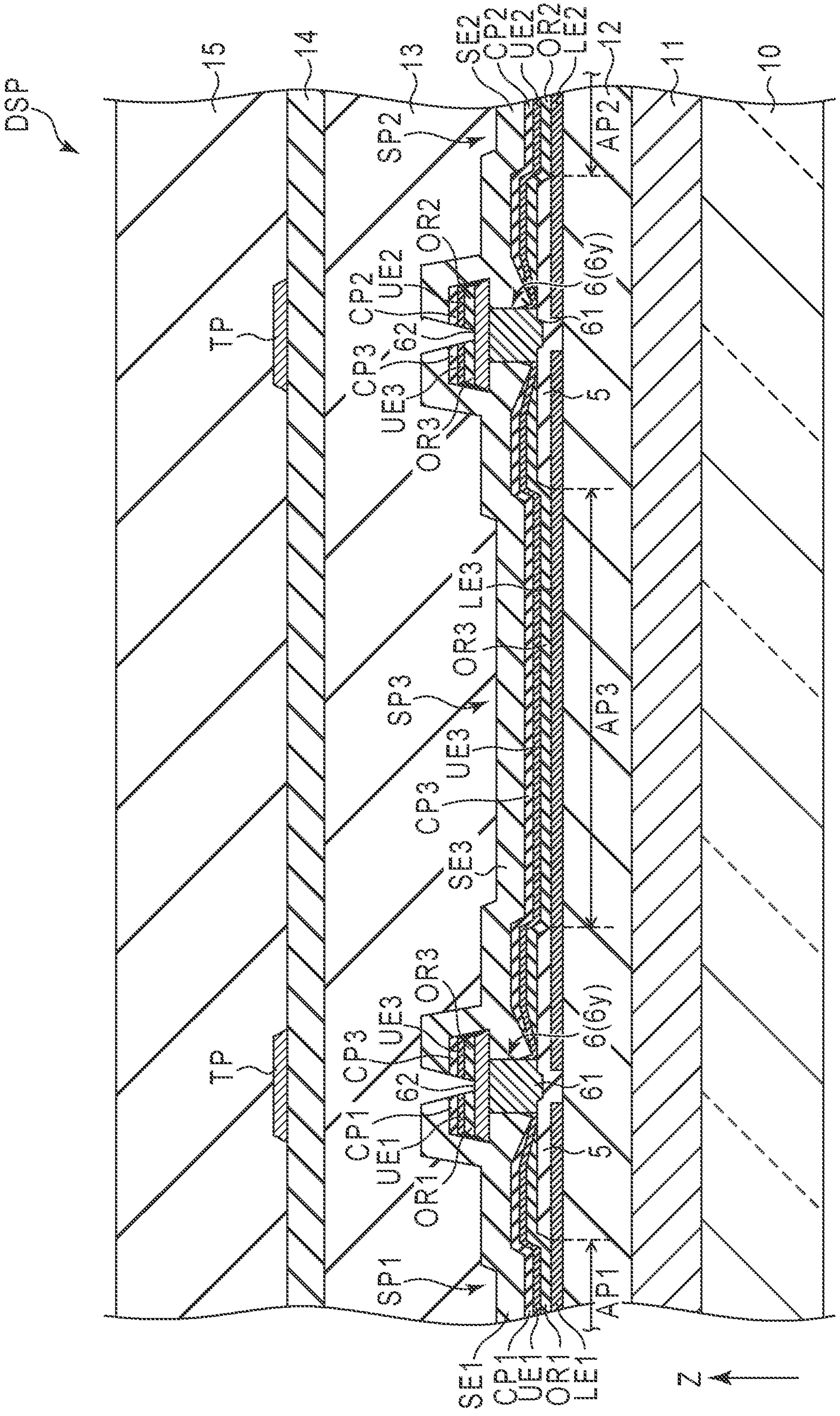
FIG. 10 is a cross-sectional view schematically showing a display device according to a modified example of the embodiment.

FIG. 10 is a cross-sectional view schematically showing elements disposed in the display area DA of the configuration in which the display device DSP has the function of a touch panel. The display device DSP shown in FIG. 10 is different in configuration from that shown in FIG. 3, that is, the touch panel electrodes TP are disposed on the sealing layer 14.

As shown in FIG. 10, the touch panel electrodes TP are located above the partition 6 and extend along the partition 6. The touch panel electrodes TP are covered by the resin layer 15. The touch panel electrodes TP are each formed, for example, of a metal material. For example, the touch panel electrodes TP have a multilayered structure of titanium (Ti), aluminum (Al), and titanium (Ti). Note here that the touch panel electrodes TP may have a multilayered structure of other metal materials or a single-layered structure. Alternatively, the touch panel electrodes TP may be formed of a transparent conductive material, specifically, indium tin oxide (ITO), indium zinc oxide (IZO) or the like.

Figure 11:
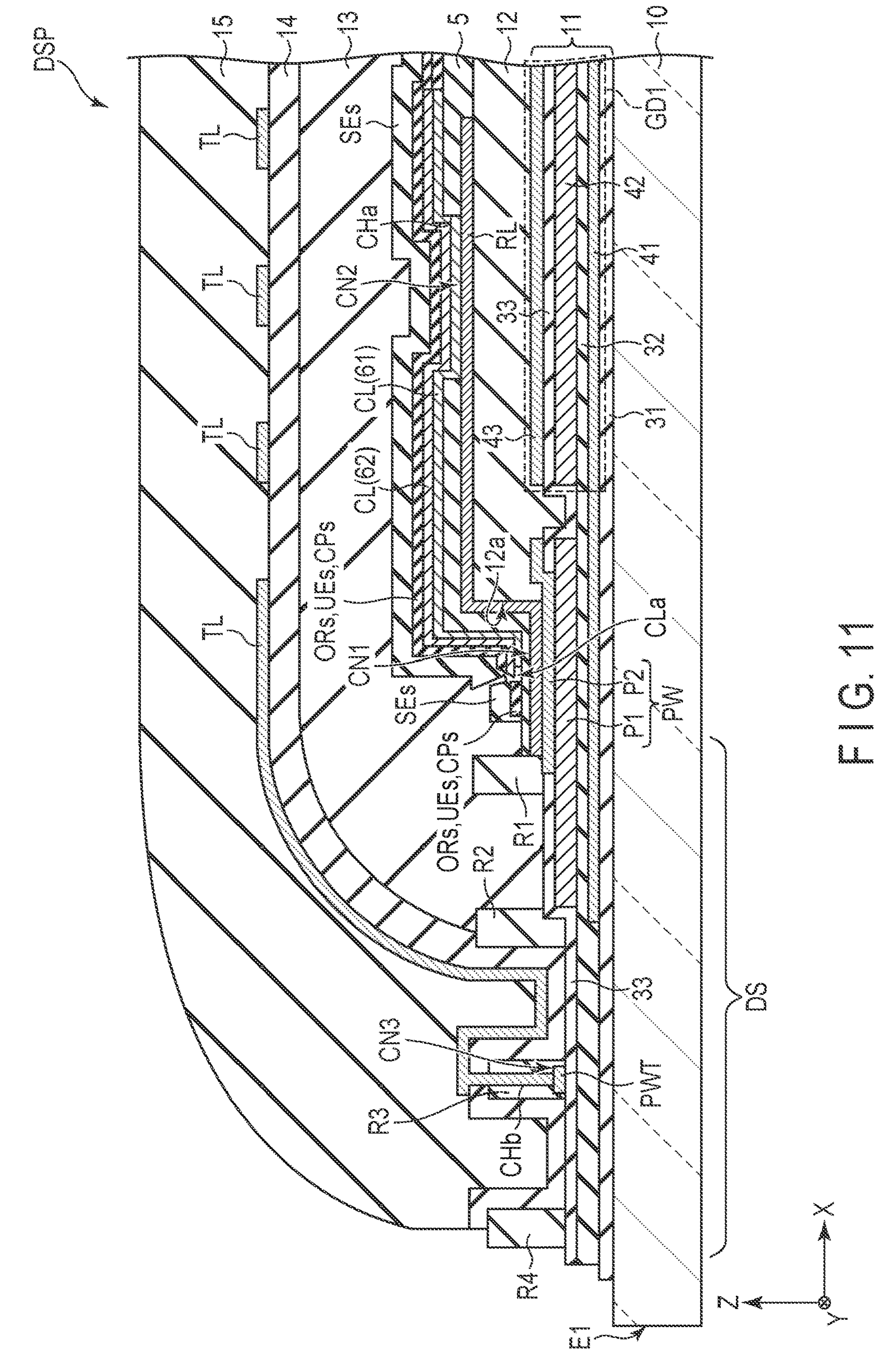
FIG. 11 is a cross-sectional view schematically showing a display device according to a modified example of the embodiment.

FIG. 11 is a cross-sectional view schematically showing elements arranged in the peripheral area SA in the configuration of a display device DSP with a touch panel function. The display device DSP shown in FIG. 11 is different in configuration from that shown in FIG. 7, that is, wiring lines TL connected to the touch panel electrodes TP are arranged on the sealing layer 14, and a power feed line PWT electrically connecting a wiring line TL and a terminal portion T (not shown in FIG. 11) to each other are disposed.

As shown in FIG. 11, the wiring line TL connected to the touch panel electrode TP is arranged on the sealing layer 14. The wiring line TL is covered by the resin layer 15. The wiring line TL is formed by the same manufacturing process using the same material as those of the touch panel electrodes TP.

The power feed line PWT (second power feed line) is disposed on the insulating layer 33 and covered by the third convex portion R3. The power feed line PWT is formed by the same manufacturing process and of the same material as those of the metal layer 43 and the second portion P2 constituting the power feed line PW. The power feed line PWT is connected to the wiring line TL in the third contact portion CN3. The third contact portion CN3 includes a contact hole CHb provided in the sealing layer 14 and the third convex portion R3. The wiring line TL is in contact with the upper surface of the power feed line PWT via the contact hole CHb.

When the configuration in which the end portion CLa of the conductive layer CL and the end portions of the organic layer ORs, the upper electrode UEs, the cap layer CPs and the sealing layer SEs are placed between the end portion 12*a* of the organic insulating layer 12 and the first convex portion R1 is applied to the display device DSP having the touch panel function, the organic layer ORs, the upper electrode UEs, the cap layer CPs, and the sealing layer SEs are not placed on the dam structure DS. Therefore, it is possible to provide the third contact portion CN3 at a location which overlaps the dam structure DS. With this configuration, the wiring line TL can be covered by the resin layer 15 in the third contact portion CN3 to protect it. Even in this case, since the organic layer ORs, the upper electrode UEs, and the cap layer CPs, which can be a pathway for moisture to enter, are not exposed to the outside, advantageous effects similar to those described above can be obtained with respect to moisture resistance.

According to one embodiment described above, it is possible to provide a display device DSP with enhanced resistance to moisture.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A display device comprising:

a substrate;

an insulating layer disposed above the substrate;

a lower electrode disposed above the insulating layer in a display area including pixels;

a rib including an aperture overlapping the lower electrode;

a partition disposed above the rib in the display area;

an upper electrode opposing the lower electrode and connected to the partition;

an organic layer disposed between the lower electrode and the upper electrode and emitting light according to a potential difference between the lower electrode and the upper electrode;

a dam structure including at least one convex portion disposed in the a peripheral area between an end portion of the substrate and the display area; and a conductive layer disposed in the peripheral area and connected to the partition, wherein the upper electrode and the organic layer are disposed in the peripheral area as well, end portions of the upper electrode and the organic layer are located between the dam structure and the display area in a plan view, and an end portion of the conductive layer is located between the end portions of the upper electrode and the organic layer and the display area in a plan view, and is covered by the upper electrode and the organic layer.

2. The display device of claim 1, wherein the dam structure includes a first convex portion surrounding the display area and a second convex portion surrounding the first convex portion, and the end portions of the upper electrode, the organic layer, and the conductive layer are each located between the first convex portion and the display area in a plan view.

3. The display device of claim 2, further comprising:

a first sealing layer covering the upper electrode and the organic layer, wherein an end portion of the first sealing layer is located between the first convex portion and the end portion of the conductive layer in a plan view.

4. The display device of claim 3, further comprising:
a first resin layer covering the upper electrode, the organic layer, and the first sealing layer, and covering at least a part of the dam structure;
a second sealing layer covering the first resin layer and covering a part of the dam structure, which is located on an outer side of the first resin layer; and
a second resin layer covering the second sealing layer.

5. The display device of claim 1, further comprising:
a pixel circuit disposed in the display area and supplying voltage to the lower electrode; and
a drive circuit disposed in the peripheral area and supplying signals to the pixel circuit, wherein
the end portion of the conductive layer is located between the dam structure and the drive circuit in a plan view.

6. The display device of claim 2, further comprising:
a first power feed line disposed in the peripheral area; and
a relay wiring line connected to the first power feed line at a first contact portion located in the peripheral area and connected to the conductive layer at a second contact portion located in the peripheral area, wherein
the rib is in contact with a side surface of the first convex portion in the peripheral area and covers the relay wiring line.

7. The display device of claim 6, wherein
the end portions of the upper electrode and the organic layer are located between the end portion of the rib and the end portion of the conductive layer in a plan view.

8. The display device of claim 1, wherein
the dam structure is formed of a same material as that of the insulating layer.

9. The display device of claim 4, wherein
end portions of the second sealing layer, the second resin layer and the substrate overlap each other in a plan view.

10. The display device of claim 4, further comprising:
a touch panel electrode disposed in the display area;
a wiring line disposed on the second sealing layer in the peripheral area and connected to the touch panel electrode; and
a second power feed line disposed in the peripheral area, wherein
the wiring line is connected to the second power feed line and covered by the second resin layer in a third contact portion located in the peripheral area.

11. The display device of claim 10, wherein
the third contact portion overlaps at least a part of the dam structure in a plan view.

* * * * *